(12) United States Patent
Reyes et al.

(10) Patent No.: US 12,627,310 B2
(45) Date of Patent: May 12, 2026

(54) AVS ARCHITECTURE FOR SAR ADC

(71) Applicant: MARVELL ASIA PTE LTD,
Singapore (SG)

(72) Inventors: Benjamin Tomas Reyes, Cordoba
(AR); Gabriele Minoia, Milan (IT);
Ray Luan Nguyen, Fountain Valley,
CA (US)

(73) Assignee: Marvel Asia Pte Ltd, Singapore (SG)

( * ) Notice: Subject to any disclaimer, the term of this
patent is extended or adjusted under 35
U.S.C. 154(b) by 192 days.

(21) Appl. No.: 18/414,525

(22) Filed: Jan. 17, 2024

(65) Prior Publication Data

US 2024/0243751 A1 Jul. 18, 2024

Related U.S. Application Data

(60) Provisional application No. 63/439,767, filed on Jan.
18, 2023.

(51) Int. Cl.
*H03M 1/10* (2006.01)
*H03M 1/00* (2006.01)
*H03M 1/06* (2006.01)
*H03M 1/12* (2006.01)
*H03M 1/38* (2006.01)

(52) U.S. Cl.
CPC ......... *H03M 1/1071* (2013.01); *H03M 1/002*
(2013.01); *H03M 1/0624* (2013.01); *H03M
1/0678* (2013.01); *H03M 1/1004* (2013.01);
*H03M 1/1014* (2013.01); *H03M 1/129*
(2013.01); *H03M 1/1215* (2013.01); *H03M
1/38* (2013.01)

(58) Field of Classification Search
CPC .... H03M 1/1071; H03M 1/1014; H03M 1/38;
H03M 1/0678; H03M 1/1004; H03M
1/0624; H03M 1/1215; H03M 1/002;
H03M 1/129
USPC ......................... 341/120, 155, 161, 163, 172
See application file for complete search history.

(56) References Cited

U.S. PATENT DOCUMENTS 10,454,492 B1   10/2019 Shikata et al.
10,539,971 B2 *  1/2020 Petrovic ................... G05F 1/46
(Continued)

FOREIGN PATENT DOCUMENTS

WO         2022207807 A1   10/2022

OTHER PUBLICATIONS

Salvador et al., "A Cortex-M3 based MCU Featuring AVS with
34nW Static Power, 15.3pJ/inst. Active Energy, and 16% Power
Variation Across Process and Temperature," Proceedings of ESSCIRC
2018—IEEE 44th European Solid State Circuits Conference, pp.
278-281, year 2018.
(Continued)

*Primary Examiner* — Khai M Nguyen
(74) *Attorney, Agent, or Firm* — Meitar Patents LTD.;
Daniel Kligler

(57)             ABSTRACT
An Integrated Circuit (IC) includes one or more functional
circuits of a given type, a test circuit including a selected one
of the functional circuits or a replica circuit of the same type
as the functional circuits, and an Adaptive Voltage Scaling
(AVS) circuit. The AVS circuit is configured to determine a
delay of the test circuit, and to adjust a supply voltage of the
functional circuits in response to the determined delay of the
test circuit.

18 Claims, 5 Drawing Sheets

(56) References Cited

U.S. PATENT DOCUMENTS 11,190,199 B1 * 11/2021 Zheng ................... H03M 1/468
2014/0247170 A1 9/2014 Nagarajan et al.

OTHER PUBLICATIONS

EP Application # 24152710.0 Search Report dated Jun. 11, 2024.
Jovanovic et al., "Vernier's Delay Line Time-to-Digital Converter,"
Scientific Publications of the State University of Novi Pazar—Ser.
A: Appl. Math. Inform. and Mech., vol. 1, issue 1, pp. 11-20, year
2009.
Elgebaly et al., "Variation-Aware Adaptive Voltage Scaling Sys-
tem," IEEE Transactions on Very Large Scale Integration (VLSI)
Systems, vol. 15, No. 5, pp. 560-571, May 2007.
Monolithic Power Systems, Inc.: "Power Consumption and Power
Management in ADCs," pp. 1-6, year 2023.
Rathnala et al., "An Efficient Adaptive Voltage Scaling Using Delay
Monitor Unit," 11th Conference on Ph.D. Research in Microelec-
tronics and Electronics (PRIME), pp. 109-112, year 2015.
Wirnshofer et al., "A Variation-Aware Adaptive Voltage Scaling
Technique based on In-Situ Delay Monitoring," 14th IEEE Inter-
national Symposium on Design and Diagnostics of Electronic
Circuits and Systems (DDECS), pp. 1-6, year 2011.

* cited by examiner

AVS ARCHITECTURE FOR SAR ADC

CROSS-REFERENCE TO RELATED APPLICATIONS

This application claims the benefit of U.S. Provisional Patent Application 63/439,767, filed Jan. 18, 2023, whose disclosure is incorporated herein by reference.

FIELD OF THE DISCLOSURE

The present disclosure relates generally to high-speed analog to digital converters (ADCs), and particularly to dynamic power setting of high-speed ADCs.

BACKGROUND

Adaptive Voltage Scaling (AVS) can be used to save power in high-speed ADCs. Without AVS, the ADC is traditionally designed to meet a specified timing requirement (e.g., minimum conversion rate) at all process corners and at the full range of operating temperatures (worst-case conditions).

As a result, when the conditions are better than worst case conditions (e.g., a typical or a fast process corner), the ADC will consume unnecessarily high power.

Conventional AVS systems typically measure the speed of a ring-oscillator to obtain an estimate of the IC speed at the given process corner and the current temperature, and then throttle the power supply voltage (and, thus, change the power consumption). In some cases, the power consumption is set to a minimum level that still safely meets a given speed requirement; in other cases, the speed is set to a maximum level that still safely meets a given power consumption budget.

SUMMARY

An embodiment that is described herein provides an Integrated Circuit (IC) including one or more functional circuits of a given type, a test circuit including a selected one of the functional circuits or a replica circuit of the same type as the functional circuits, and an Adaptive Voltage Scaling (AVS) circuit. The AVS circuit is configured to determine a delay of the test circuit, and to adjust a supply voltage of the functional circuits in response to the determined delay of the test circuit.

In some embodiments, the functional circuits include Analog-to-Digital Converters (ADCs) and the test circuit includes a test ADC, and the AVS circuit is configured to determine a conversion delay of the test ADC, the conversion delay being a time duration needed for converting an analog input value into a corresponding digital value. In an example embodiment, each of the functional ADCs, and the test ADC, include Successive Approximation Register (SAR) ADCs, each ADC having a respective variable conversion delay.

In a disclosed embodiment, the one or more functional ADCs include a multiplicity of functional ADCs configured to sample respective mutually-delayed replicas of an input signal at a first sampling rate, thereby forming an interleaved ADC that samples the input signal at a second sampling rate, higher than the first sampling rate.

In an embodiment, the test ADC is configured to output an End-of-Conversion (EoC) signal indicative of completion of each conversion operation, and the AVS circuit is configured to determine the conversion delay responsively to the EoC signal. In an example embodiment, the AVS circuit includes (i) a Time-to-Digital Conversion circuit (TDC), which is configured to convert a reference clock to a first digital value, and to convert the EoC signal to a second digital value, and (ii) logic, configured to generate a voltage correction instruction based on a difference between the first digital value and the second digital value.

In some embodiments, the IC further includes a power supply having an output that is adjustable, the power supply being configured to provide the supply voltage of the functional circuits, and the AVS circuit is configured to control the adjustable power supply to adjust the supply voltage of the functional circuits.

In an embodiment, the AVS circuit is configured to determine the delay of the test circuit for multiple values of the supply voltage, and to set the supply voltage to a value that minimizes a power consumption of the functional circuits. In an embodiment, the AVS circuit is configured to determine the delay of the test circuit for multiple values of the supply voltage, and to set the supply voltage to a value that minimizes a power consumption of the functional circuits while still meeting a speed requirement of the functional circuit. In an embodiment, the AVS circuit is configured to determine the delay of the test circuit for multiple values of the supply voltage, and to set the supply voltage to a value that minimizes a power consumption the functional circuit but is greater than a preset minimal voltage.

There is additionally provided, in accordance with an embodiment described herein, an Adaptive Voltage Scaling (AVS) method in an Integrated Circuit (IC) that includes (i) one or more functional circuits of a given type and (ii) a test circuit including a selected one of the functional circuits or a replica circuit of a same type as the functional circuits. The method includes determining a delay of the test circuit, and adjusting a supply voltage of the functional circuits in response to the determined delay of the test circuit.

The present disclosure will be more fully understood from the following detailed description of the embodiments thereof, taken together with the drawings in which:

DETAILED DESCRIPTION OF EMBODIMENTS

Figure 1:
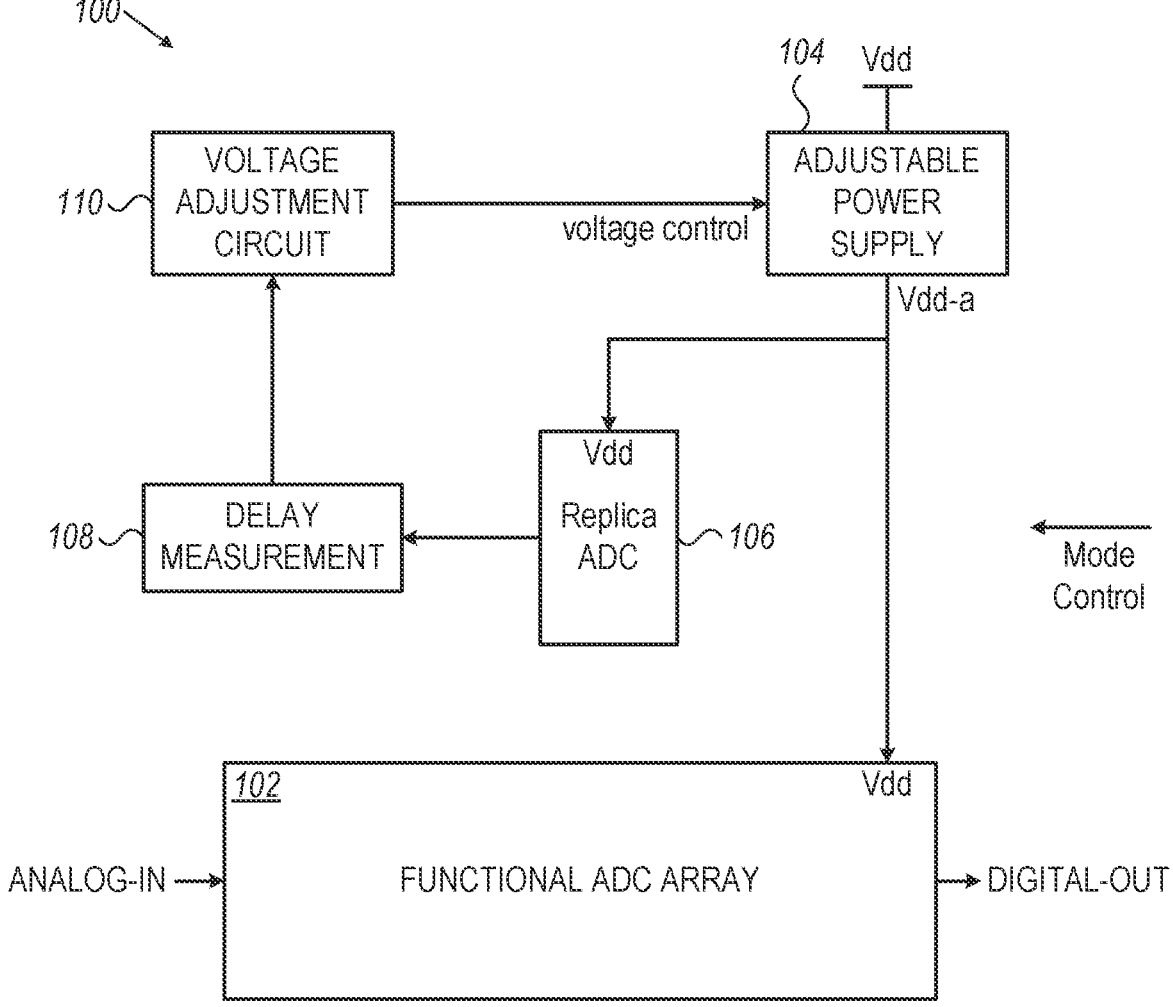
FIG. 1 is a block diagram that schematically illustrates an Analog to Digital Converter (ADC) System with Adaptive Voltage Scaling (AVS), in accordance with an embodiment that is described herein.

Voltage scaling is a power management technique used in electronic systems to optimize performance. In some implementations, voltage scaling is alternatively or additionally used to increase energy efficiency of integrated circuits (ICs). Voltage scaling techniques typically involve dynamically adjusting the operating voltage of circuitry based on current workload and performance requirements. Adaptive Voltage Scaling (AVS) is a specific implementation of voltage scaling that involves dynamically adjusting the voltage supply of the circuitry to achieve a desired performance target and/or to lower power consumption (in the discussion and embodiments descriptions below, we will refer solely to AVS implementations that adjust the voltage supply while meeting a given performance requirement).

AVS helps mitigate the impact of manufacturing process variations and different operating temperatures—without AVS, the circuitry is designed to meet the timing requirements in worst-case conditions, and, hence, may be over-driven or may consume excessive power when the conditions are better than worst case conditions. With AVS, the power consumption may be adjusted to the minimum power needed to meet a performance target such as to meet timing requirements (or slightly more, to mitigate inaccuracies and noise effects).

Embodiments that are described herein provide for circuits and methods that implement AVS in electronic systems that comprise an array of circuits of a certain type, and a control circuit; the control circuit comprises (i) a test circuit, which may comprise either a replica of the circuits of the array or a selected one of the circuits of the array and (ii) a performance estimation circuit that estimates the performance of the test circuit; the control circuit then adjusts the voltage level of the power supply so as to reduce the power consumption while still meeting the timing requirements.

The embodiments described below refer mainly to a replica circuit serving as a test circuit. Alternatively, however, one of the functional circuits of the array can also be selected to serve as a test circuit for implementing the disclosed AVS techniques. We will refer hereinbelow mainly to ADC systems, i.e., to an ADC array and a replica ADC; however, the present disclosure is by no way limited to ADC systems; AVS may be applied to other suitable electronic systems, such as systems comprising arrays of multipliers or Arithmetic Logic Units (ALUs), in alternative embodiments.

In the present context, the term "replica circuit" (e.g., "replica ADC") refers to a circuit that is of the same (or nearly the same) design as the operational circuits (e.g., operational ADCs), such that the delay (e.g., conversion delay) of the replica circuit is highly indicative of the delays of the operational circuits over process, voltage and temperature (PVT) variations. In the example embodiments described herein, the test circuit used for AVS-related measurements is a replica circuit that is not one of the operational circuits, i.e., it is dedicated for use in AVS. In alternative embodiments, one of the functional circuits can serve both as one of the operational circuits and as a test circuit for AVS purposes.

In an example embodiment, an ADC system comprises an ADC Array and a control circuit; the ADC array typically comprises multiple identical ADC units (for example, an interleaved SAR ADC typically comprises multiple ADC units that are interleaved). The identical ADC units will also be referred to below as Functional ADCs.

The Control Circuit comprises a Replica ADC, that is identical to the functional ADC units, and adjusts the voltage level of the power supply to minimize the difference between an actual ADC conversion time and a reference conversion time, generated by a Reference Timing Generator. In embodiments, the control circuit comprises a Time-to-Digital (TDC) circuit, that is configured to convert both the reference conversion time and the Replica ADC conversion time to a digital representation. In some embodiments the control circuit further comprises a Firmware circuit, that calculates a new power supply voltage according to the TDC outputs for the reference and replica-ADC conversion time representations. In an embodiment, the firmware adjusts the voltage level according to a Least Mean Square (LMS) algorithm. In some embodiments, the control circuit further comprises a Digital-to Analog (DAC) circuit, that converts the firmware output to an analog signal that is input to a Low-Drop-Out (LDO) adjustable power supply, which outputs the power supply of the functional (and the replica) ADCs.

FIG. 1 is a block diagram that schematically illustrates an Analog to Digital Converter (ADC) System 100 with Adaptive Voltage Scaling (AVS), in accordance with an embodiment that is described herein. ADC System 100 comprises an ADC array 102 that is configured to convert analog input to digital output.

In the embodiments hereinbelow, interleaved pipe-lines successive-approximation-register (SAR) ADCs are discussed by way of example; however, other ADC architectures may be used in alternative embodiments, including, for example Dual-Slope ADC, Flash-ADC, Sigma-Delta ADC; pipelined and non-pipelined; single or multiple conversion channels, and others. As noted above, the disclosed techniques can also be used with arrays of other circuits or components, such as multipliers or ALUs.

In typical embodiments, the ADC array comprises multiple equivalent circuits (referred to as ADC basic units, or functional ADCs); for example, an interleaved pipelined SAR ADC may comprise multiple SAR ADC units.

In embodiments, the ADC array is specified to convert analog inputs at a given conversion rate. For example, in some embodiments, the ADC array should complete a conversion at a given time-period according to the frequency of an input clock. The actual conversion speed is typically a function of the process corner (e.g., fast, or slow NMOS and PMOS transistors), the operating voltage and the ambient temperature (collectively referred to as PVT). When the PVT combination is such that the conversion rate is higher than needed, each functional ADC may pause between successive conversions, e.g., to wait for the next clock edge. Typically, the conversion time of the ADC array is determined according to the timing performance of the ADC basic units; for example, in pipelined ADCs, the conversion rate of the ADC may be equivalent to the conversion rate of any ADC basic unit.

In accordance with the embodiment illustrated in FIG. 1 and described herein, the ADC regulates the power supply voltage of the ADC array (thus, reducing the V component of the PVT) to achieve a conversion rate marginally exceeding the required conversion rate. Consequently, the ADC array pauses for a shorter period. This reduces power consumption without compromising the specified conversion speed requirement.

ADC 100 further comprises an adjustable power supply 104, a Replica ADC 106, a Delay Measurement Circuit 108 and a Voltage Adjustment circuit 110. Adjustable Power Supply 104 is configured to output a supply current at a voltage that is determined according to a voltage-control input. In a non-limiting example embodiment, the adjustable power supply may comprise a Low Drop-Out (LDO) regulator with an analog voltage control input; in other embodiments the adjustable power supply may comprise, for example, a digitally adjustable power supply; in yet another embodiment, the adjustable power supply may be a switching regulator, that reduces the voltage by timed switching (and, hence, achieves better power efficiency). In embodiments, the adjustable power supply may be external (e.g., in another integrated circuit).

Replica ADC 106 exhibits the same timing characteristics as each of the Functional ADCs, and may comprise, for example, a single ADC basic unit, or a circuit which is well matched to the ADC basic unit.

The Delay Measurement circuit 108 continuously measures the conversion delay of the Replica ADC and indicates the measured delay to the Voltage Adjustment Circuit 110. The Voltage Adjustment Circuit controls, through a Voltage Control output, the output voltage of the adjustable power supply (in embodiments, the voltage control output may be digital or analog). In embodiments, the Voltage Adjustment Circuit is configured to control the Replica ADC supply voltage, through the adjustable power supply, to decrease the pause period (but, in an embodiment, keeping the pause period above a preset minimum value). The ADC array, which comprises basic ADC units (functional ADCs) that are closely matched to the Replica ADC, will also have decreased pause period.

In some embodiments, the ADC System may be in one of several modes of operations (e.g., Calibrate, Bypass). The mode of operation is set by an external indication and will be discussed below.

Thus, according to the example embodiment illustrated in FIG. 1 and described hereinabove, by examining delays in a replica ADC, a voltage adjustment circuit can modify the voltage of the ADC array supply so that the conversion speed is not unnecessarily high, thereby keeping the power consumption relatively low.

Figure 2:
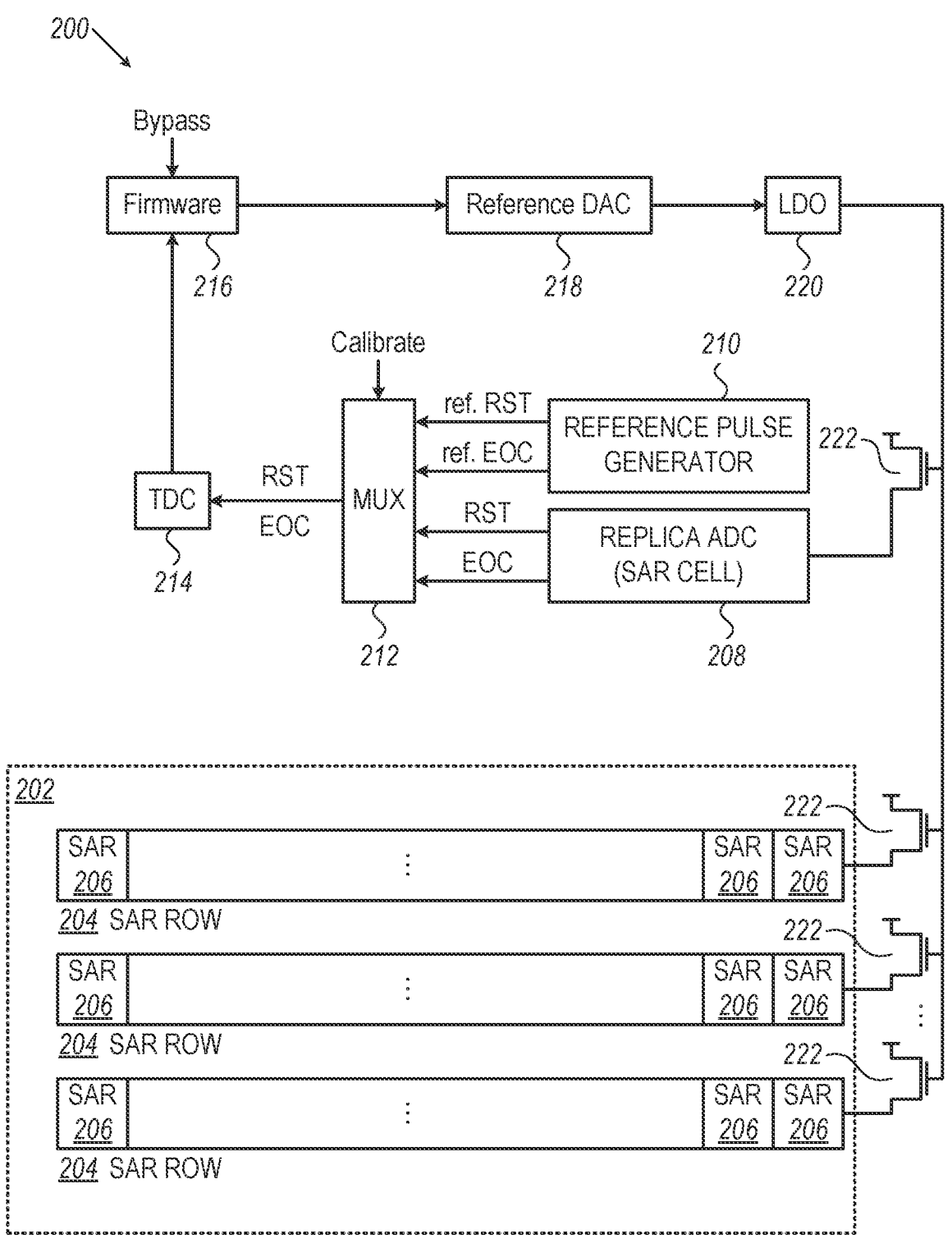
FIG. 2 is a block diagram that schematically illustrates an Interleaved Successive Approximation Register (SAR) ADC system with AVS, in accordance with an embodiment that is described herein.

FIG. 2 is a block diagram that schematically illustrates an Interleaved SAR ADC system 200 with Adaptive Voltage Scaling (AVS), in accordance with an embodiment that is described herein. ADC System 200 comprises an interleaved SAR ADC array 202, which, in turn, comprises a plurality of interleaved (timewise) SAR rows 204, each SAR Row comprising SAR circuits 206; in an embodiment, all SAR circuits 206 are identical (and are referred to as the basic ADC units). (ADC Interleaving is a technique in which, to increase speed, multiple ADC circuits convert progressively delayed versions of the same input signal, thus simulating a single higher speed ADC.)

The Interleaved SAR ADC system 200 further comprises a Replica ADC SAR cell 208, a Time to Digital (TDC) converter 214, a Multiplexer 212, a Reference Time Generator 210, a Firmware 216, a Reference Digital to Analog Converter (DAC) 218, an LDO 220 and a plurality of Source-Follower-configured NMOS transistors 222. The power input of SAR rows 204, as well as the power input of the Replica ADC 208, are driven by the source terminals of respective NMOS transistors 222, which transfer the voltage output by LDO 220. In the shown example, the output of LDO 220 is reduced by the Gate-Source voltage (Vgs) of transistors 222. In an embodiment, transistors 222 are identical (e.g., they share the same layout) and, thus, the power supply voltage to all basic ADC units and to the replica ADC will be closely matched.

Replica-ADC 208, Multiplexer 212, TDC 214, Firmware 216, Reference-DAC 218 and LDO 220, collectively realize a closed-loop control function that converges the ADC conversion delay to a target delay value. The TDC converts the delay to digital form; the Firmware realizes a digital transfer function; the Reference DAC converts a digital voltage value to an analog control signal that controls the voltage of the LDO and, hence, the power supply voltage setting of the Replica ADC.

According to the example embodiment illustrated in FIG. 2, the Replica ADC (and each of the basic ADC cells) outputs a Reset pulse when starting an analog to digital conversion, and an End-of-Conversion (EOC) pulse when completing the conversion. The time delay between the Reset and the EOC pulses is determined according to the conversion time. Reference Pulse Generator 210 is configured to generate reference Reset and EOC pulses, wherein the phase difference between the reference-Reset and the reference-EOC pulses is determined according to the conversion time (typically equal to the required conversion period time, minus a pause time).

TDC 214 is configured to translate a phase difference (e.g., a time delay) between a Reset input to an EOC input, to a digital readout. Multiplexer 212 is configured to forward to the TDC either the Reset and EOC pulses generated by the Reference Pulse Generator, or, the same, generated by Replica ADC 208. In an embodiment, the multiplexer is configured to first (e.g., following an Initialize input) forward the reference Reset and the Reference EOC, and, subsequently and continuously, forward the Reset and EOC input that the Replica ADC outputs. In other example embodiments, the multiplexer continuously toggles between forwarding the reference Reset and EOC and the Replica ADC Reset and EOC.

The digital output of TDC 214, thus, alternately represents the reference phase delay (between the Reset and EOC pulses generated by Reference Pulse Generator 210) and the Replica-ADC phase delay (between the corresponding replica-ADC signals). Firmware 216, which may comprise programmable logic, such as a DSP, receives the delays from the TDC, and determines if and by how much the LDO voltage should be modified. In an example embodiment, Firmware 216 is configured to implement a transfer function that regulates the LDO output voltage, for example, using Least Mean Square (LMS) algorithm, to reach the reference phase difference with minimum error and without any overshoot or undershoot. In another example embodiment, Firmware 216 increments, or decrements, the LDO output voltage by a small amount, according to the sign of the difference between the reference and the replica-ADC phases. In embodiments, Firmware 216 also digitally low pass-filters one or both digital inputs, to mitigate noisy phase measurements.

The output of Firmware 216, representing the LDO voltage control, is input to Reference DAC 218, which converts the digital input to the analog voltage-control signal that is input to LDO 220.

The configuration of Pipelined Interleaved SAR ADC system 200, illustrated in FIG. 2 and described hereinabove is cited by way of example. Other configurations may be used in alternative embodiments. For example, in some embodiments there is no reference pulse generator; instead, Firmware 216 is configured to receive a target conversion delay (preset or set by a processor). In some environments, LDO 220 comprises a digital control, and, hence, Reference DAC 218 is not used. In other embodiments, an analog AVS is implemented, wherein the voltage regulator is responsive to voltage levels of an analog control signal.

Time to Digital conversions can be implemented in a variety of methods, including, for example, Vernier Time to Digital Conversion. The reader is referred to "a Vernier Delay-Line Time-to-Digital Converter", J. S. Jovanovic et. al., SCIENTIFIC PUBLICATIONS OF THE STATE UNI- VERSITY OF NOVI PAZAR SER. A: APPL. MATH. INFORM. AND MECH. vol. 1, 1 (2009), 11-20.

In some examples, the ADC system has three distinct operating modes:

1. Bypass—when in Bypass mode, the ADC system bypasses the AVS circuitry, and the adjustable power supply outputs a voltage level that fits the worst-case conditions, in terms of process corner and temperature. No power consumption is saved in non-worst-case conditions.

2. Calibrate—The ADC system enters this mode following an Initial (or a Calibrate) indication; the initial indication is typically asserted after reset or following system reconfiguration; in some embodiments the Initial indication is asserted periodically, or when system-errors are detected (for example, if the ADC is part of a communication system, when a decoder that receives the digital outputs detects communication errors). When in Calibrate mode, Multiplexer 212 (FIG. 2) sends the reference Reset and EOC signals to the TDC 214, and Firmware 216 registers the target conversion period.

3. Functional Mode. The ADC system, while in this mode, adjusts the power supply voltage to maximize the conversion time (but keeping it safely above the specified rate), thus minimizing the power consumption. When in Functional mode, Multiplexer 212 (FIG. 2) sends the Replica-ADC Reset and EOC signals to the TDC 214.

In some embodiments, the Firmware is configured to realize, while in Functional Mode, the following transfer function:

$$\text{a. } err[n] = tdc\_ref\_code - tdc\_out[n]$$

$$\text{b. } vdd\_a[n] = vdd\_a[n-1] + \mu * err[n]$$

where tdc_ref_code is the output of TDC 214 (FIG. 2) in Calibrate Mode, tdc_out[n] is the output of the TDC in Functional Mode, at an $n^{th}$ timeslot, err[n] is the error estimate for the $n^{th}$ timeslot, $\mu$ is a convergence time constant and vdd_a[n], vdd_a[n−1] are the voltage levels that LDO 220 outputs at the $n^{th}$ and the $n+1^{th}$ timeslots, respectively.

The Functional Mode may be divided to two sub-modes

Unlocked, when the conversion rate is substantially different from the specified rate (e.g., shortly after switching from a Bypass Mode or a Calibrate Mode to the Functional Mode), and, Locked, when the conversion rate closely follows the specified conversion rate.

Figure 3:
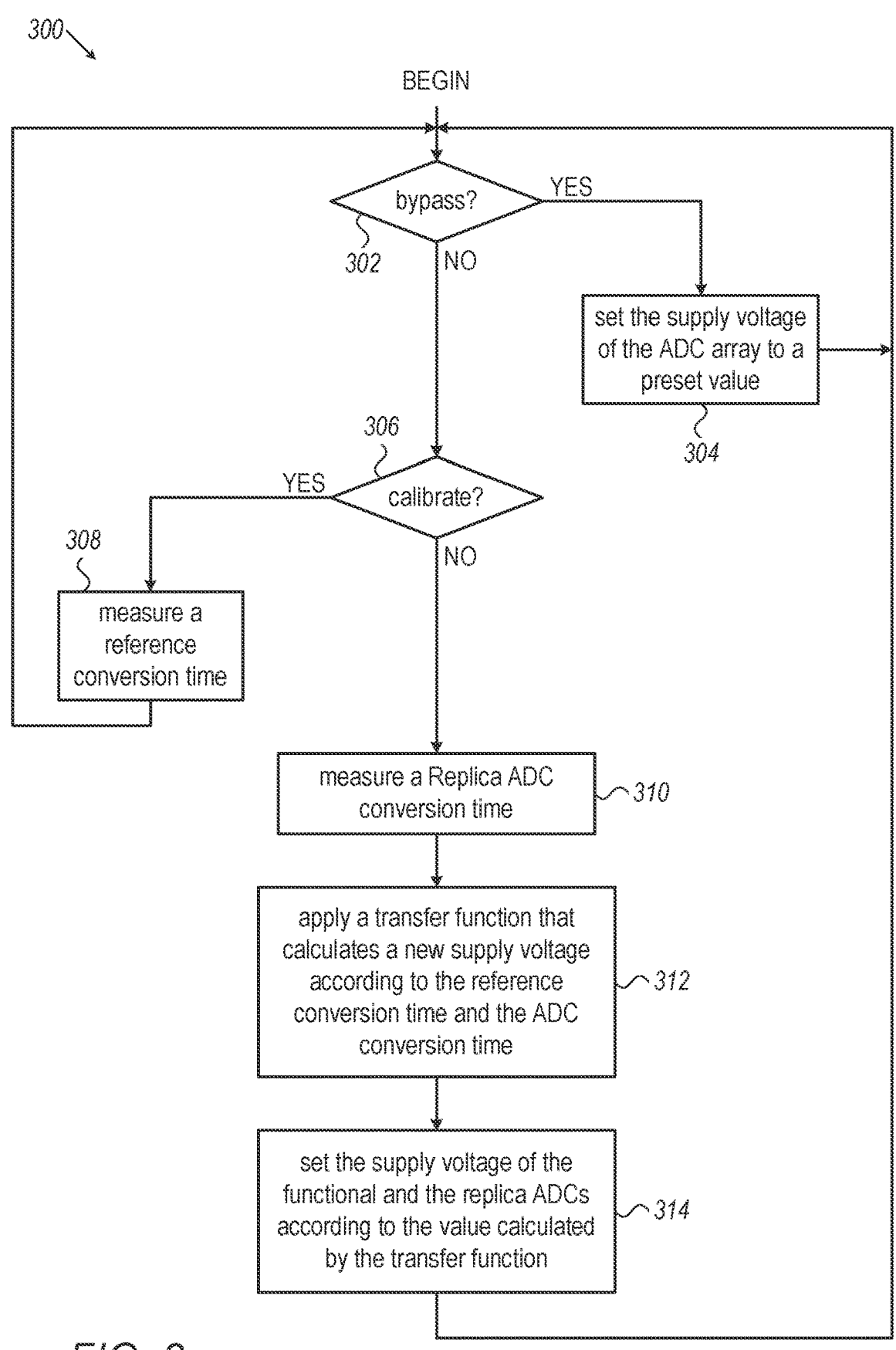
FIG. 3 is a flowchart that schematically illustrates a method for AVS of an ADC, in accordance with an embodiment that is disclosed herein.

FIG. 3 is a flowchart 300 that schematically illustrates a method for adaptive voltage scaling (AVS) of an Analog to Digital Converter (ADC), in accordance with an embodiment that is disclosed herein. The flowchart is executed by SAR ADC system 200, which has been described above, with reference to FIG. 2, and by subunits thereof.

The flowchart starts at a Check-Bypass operation 302, wherein the SAR ADC system checks if a Bypass Mode is on. In some embodiments, Bypass Mode is set by circuitry that is not part of the SAR ADC system, e.g., by a processor that is in the same integrated circuits.

If Bypass Mode is on, the flowchart enters a Set-Preset-Supply-Voltage operation 304, wherein the SAR ADC system sets the supply voltage to a preset voltage level. In some embodiments, Firmware 216 will output a digital value corresponding to the preset voltage level. In other embodiments, the preset voltage will be input to LDO 220, replacing the output of Reference-DAC 218. After operation 304 the flowchart reenters operation 302.

If, in operation 302, the Bypass Mode is not on, the flowchart enters a Check-Calibrate operation 306, wherein the SAR ADC system checks if a Calibrate Mode is on. In some embodiments, Calibrate Mode is set by circuitry that is not part of the SAR ADC system, e.g., a Reset pulse, or an input from an error detection circuitry that is not part of the ADC system. If so, the SAR ADC system will enter a Measure Reference Conversion Time operation 308, wherein TDC 214 determines a reference conversion time (generated by Reference Time Generator 210), and then reenters operation 302.

If, in operation 306, the SAR ADC System is not in Calibrate Mode (and, hence, the SAR ADC System is in the Functional Mode), the SAR ADC system enters a Measure Replica Conversion Time operation 310, wherein TDC 214 measures the conversion time of Replica ADC 208, from Reset to EOC. As Replica ADC 208 is layout-identical to the ADC units 206 of ADC array 202, the TDC output will be closely matched to the ADC array conversion rate.

Next, at an Apply Transfer Function operation 312, Firmware 216, calculates the new value for the output voltage according to the reference conversion period and the Replica-ADC conversion period, and modifies the LDO power supply voltage to minimize the difference between the two periods. In an embodiment, an LMS-type function can be used, e.g., $$\text{a. } err[n] = tdc\_ref\_code - tdc\_out[n]$$

$$\text{b. } vdd\_a[n] = vdd\_a[n-1] + \mu * err[n]$$

where tdc_ref_code is the reference conversion period, tdc_out[n] is the Replica ADC conversion period at an $n^{th}$ timeslot, err[n] is the error estimate for the $n^{th}$ timeslot, $\mu$ is a convergence time constant and vdd_a [n], vdd_a[n−1] are the voltage levels that the LDO outputs at the $n^{th}$ and the $n+1^{th}$ timeslots, respectively.

Lastly, in a Set-Supply-Voltage operation 314, the output voltage of LDO 220 is set according to vdd_a[n]. After operation 314 the flowchart reenters operation 302.

The configuration of flowchart 300 illustrated in FIG. 3 and described hereinabove is an example that is cited merely for the sake of conceptual clarity. Other configurations may be used in alternative embodiments. For example, in some embodiments, the checking of a Bypass and/or a calibrate mode may be done in parallel to other operations, and the flowchart may exit to Bypass operation 304 and/or Calibrate operation 308 directly from all other operations.

The following examples graphically describe the performance of an example embodiment.

Figure 4:
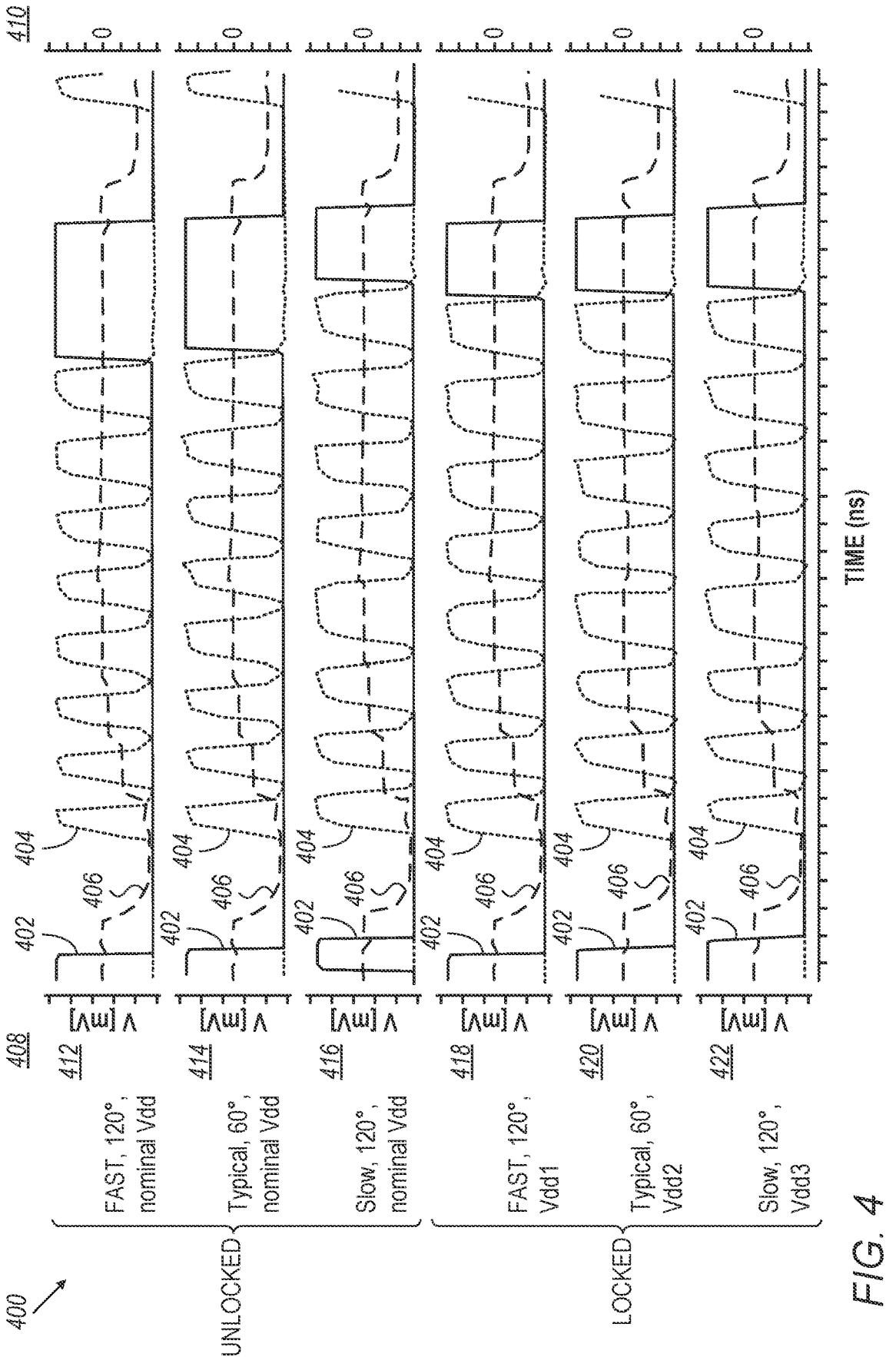
FIG. 4 is a timing diagram that schematically illustrates key signals of a functional ADC, in accordance with an embodiment that is disclosed herein.

FIG. 4 is a timing diagram 400 that schematically illustrates key signals of a functional ADC, in accordance with an embodiment that is disclosed herein.

According to the waveforms illustrated in FIG. 4, the ADC resolution is 8-bit. The Reset and EOC indications are combined into a single signal (RST/EOC below), wherein Reset is indicated by the signal's falling edge and EOC by the rising edge. The basic ADC unit resolves bits, from the MS-bit to the LS-bit, wherein for each bit, the current bit is determined according to the polarity of a difference signal, indicating the difference between a reference DAC output and the input signal.

Timing Diagram 400 depicts six sets of waveforms, each set comprising a waveform 402 showing the RST/EOC signal of the ADC basic units (and the Replica ADC) 402, a waveform 404 illustrating an internal conversion clock (that toggles for every resolved bit), and a waveform 406 representing the difference signal.

A waveform set 412 includes the timing waveforms for a fast process corner, nominal power supply voltage and ambient temperature of 120°; a waveform set 414 includes the timing waveforms for a typical process corner, nominal power voltage and ambient temperature of 60° and, a waveform set 416 includes the timing waveforms for a slow process corner, nominal power supply voltage and ambient temperature of 120°. Waveform sets 412, 414 and 416 illustrate the timing waveform in the unlocked sub-mode (e.g., shortly after switching from Calibrate to Functional mode). The EOC timing (rising edge of 402) increases from waveform set 412 to 414 and on to 416.

As a result of operation of the AVS circuitry, the power supply voltages change, and a uniform EOC timing ensues, as shown in the next three waveform sets:

A waveform set 418 includes the timing waveforms for the fast process corner and ambient temperature of 120°; a waveform set 420 includes the timing waveforms for the typical process corner and ambient temperature of 60°; and, a waveform set 422 includes the timing waveforms for the slow process corner and ambient temperature of 120°. As can be seen, the EOC timing is the same for the three locked waveform sets 418, 420 and 422; the power supply voltage levels for waveforms sets 418, 420 and 422 are, respectively, Vdd1, Vdd2 and Vdd3, where Vdd1<Vdd2<vdd3.

Figure 5:
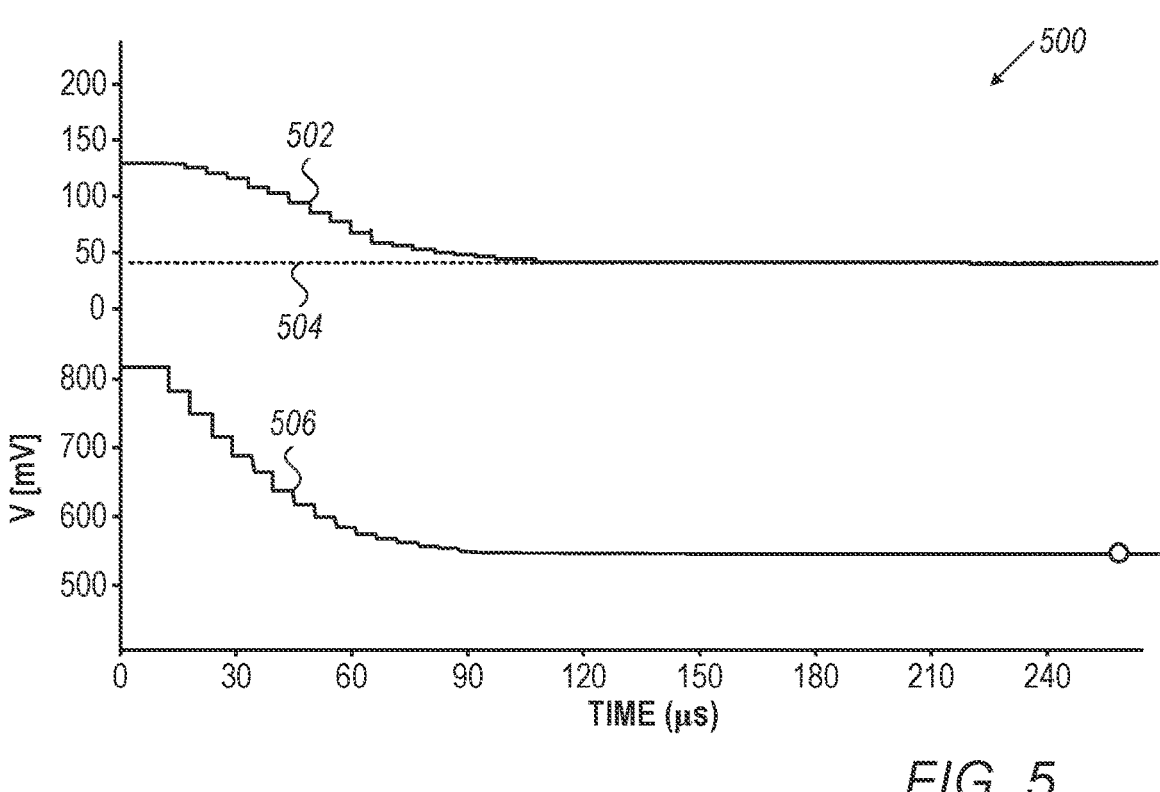
FIG. 5 is a timing diagram that schematically illustrates functional-mode convergence in an ADC, in accordance with an embodiment that is described herein.

FIG. 5 is a timing diagram 500 that schematically illustrates functional-mode convergence in an ADC, in accordance with an embodiment that is described herein. A conversion-time waveform 502 illustrates the output of TDC 214 (FIG. 2) in response to the Replica-ADC conversion time, a reference-time waveform 504 illustrates the output of the TDC in response to the reference pulse generator conversion time, and a Vdd waveform 506 illustrates the power supply voltage. As can be seen, both the power supply voltage and the conversion-time start at a high level. A large difference between the conversion time and the reference time then causes Vdd 506 to continually drop; this drop is followed by a drop in the conversion-time 502, and continues until graph 502 merged with graph 504.

In embodiments, the reference conversion time is designed such that the time from EOC to the next Reset will be safely larger than zero, to assure that the conversion will never immaturely end. A safety minimum margin is defined, and the firmware is designed to guarantee the minimum margin in all conditions and in noisy environments.

Figure 6:
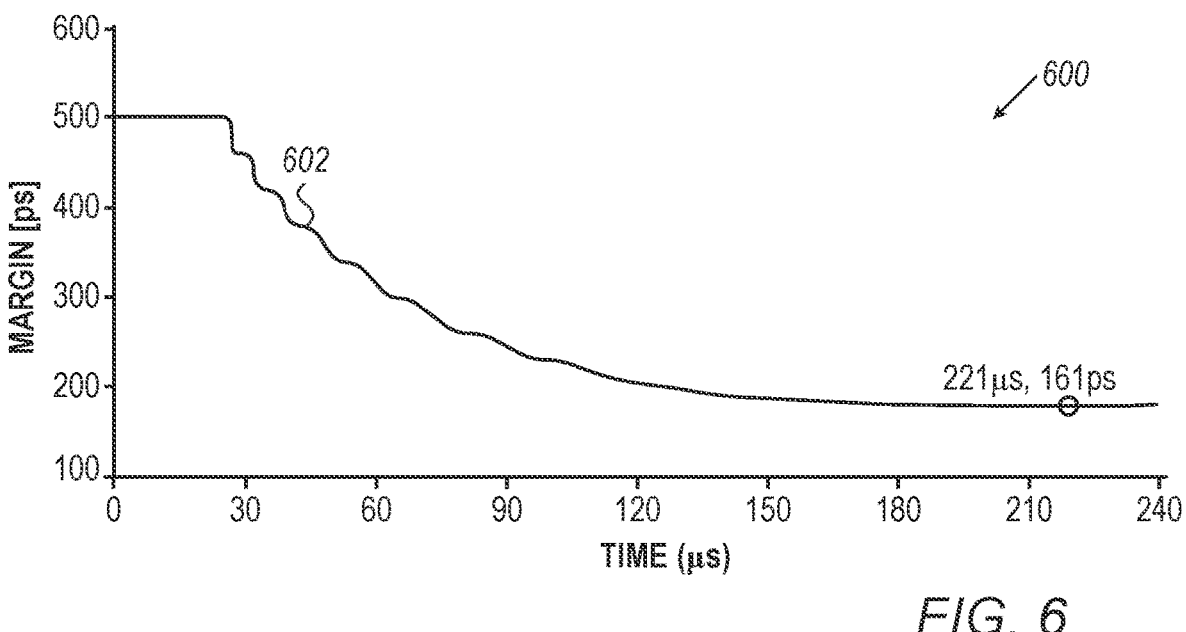
FIG. 6 is a timing diagram that schematically illustrates a timing margin waveform, in accordance with an embodiment that is described herein.

FIG. 6 is a timing diagram 600 that schematically illustrates a timing margin waveform 602, in accordance with an embodiment that is described herein. The minimum margin, according to the embodiment illustrated in FIG. 6, is 161 ps (other suitable minimum margin values can be used in alternative embodiments).

As can be seen, the margin starts, (e.g., in the unlocked-sub-mode), substantially above the reference margin. The microcode then gradually decreases the margin until, after 221 μs, the minimum margin is achieved.

Because of induced noise, the descend of the margin is not smooth or uniform, but the value of the minimum margin is such that the margin will never reach zero.

The configuration of ADC system 100 (FIG. 1), SAR-ADC system 200 (FIG. 2), Firmware 216, Reference-DAC 218, LDO 220, Replica-ADC 208, and Reference Pulse Generator 210; and the method of flowchart 300 (FIG. 3) are example configurations and methods that are shown purely for the sake of conceptual clarity. Any other suitable configurations and methods can be used in alternative embodiments.

In various embodiments, ADC system 100, SAR-ADC system 200, including any or all sub-units thereof, may be carried out by hardware, by software, or by combination of hardware and software.

In various embodiments, ADC system 100 may be implemented using suitable hardware, such as one or more Application-Specific Integrated Circuits (ASIC) or Field-Programmable Gate Arrays (FPGA), or a combination of ASIC and FPGA.

Firmware 216 (FIG. 2) may comprise one or more general-purpose processors, which are programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Although the embodiments described herein mainly address AVS in ADC systems, the methods and systems described herein can also be used for performing AVS in other applications in which the delay of a circuit is sensitive to PVT.

It is thus noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An Integrated Circuit (IC), comprising:

one or more functional circuits of a given type;

a test circuit, comprising a selected one of the functional circuits or a replica circuit of a same type as the functional circuits, the test circuit configured to generate a signal indicative of a delay of the test circuit; and an Adaptive Voltage Scaling (AVS) circuit comprising:

a Time-to-Digital Conversion circuit (TDC), configured to convert a reference clock into a first digital value, and to convert the signal indicative of a delay of the test circuit into a second digital value; and logic, configured to adjust a supply voltage of the functional circuits based on a difference between the first digital value and the second digital value produced by the TDC.

2. The IC according to claim 1, wherein:

the functional circuits comprise Analog-to-Digital Converters (ADCs) and the test circuit comprises a test ADC; and the delay of the test circuit comprises a conversion delay of the test ADC, the conversion delay being a time duration needed for converting an analog input value into a corresponding digital value.

3. The IC according to claim 2, wherein each of the functional ADCs, and the test ADC, comprise Successive Approximation Register (SAR) ADCs, each ADC having a respective variable conversion delay.

4. The IC according to claim 2, wherein the or more functional ADCs comprise a multiplicity of one functional ADCs configured to sample respective mutually-delayed replicas of an input signal at a first sampling rate, thereby forming an interleaved ADC that samples the input signal at a second sampling rate, higher than the first sampling rate.

5. The IC according to claim 2, wherein the signal indicative of the delay comprises an End-of-Conversion (EoC) signal indicative of completion of each conversion operation.

6. The IC according to claim 1, further comprising a power supply having an output that is adjustable, the power supply being configured to provide the supply voltage of the functional circuits, wherein the AVS circuit is configured to control the adjustable power supply to adjust the supply voltage of the functional circuits.

7. The IC according to claim 1, wherein the AVS circuit is configured to determine the delay of the test circuit for multiple values of the supply voltage, and to set the supply voltage to a value that minimizes a power consumption of the functional circuits.

8. The IC according to claim 1, wherein the AVS circuit is configured to determine the delay of the test circuit for multiple values of the supply voltage, and to set the supply voltage to a value that minimizes a power consumption of the functional circuits while still meeting a speed requirement of the functional circuit.

9. The IC according to claim 1, wherein the AVS circuit is configured to determine the delay of the test circuit for multiple values of the supply voltage, and to set the supply voltage to a value that minimizes a power consumption the functional circuit but is greater than a preset minimal voltage.

10. An Adaptive Voltage Scaling (AVS) method, comprising:

performing the following in an Integrated Circuit (IC) that includes (i) one or more functional circuits of a given type and (ii) a test circuit, comprising a selected one of the functional circuits or a replica circuit of a same type as the functional circuits, the test circuit configured to generate a signal indicative of a delay of the test circuit:

converting a reference clock into a first digital value using a Time-to-Digital Conversion circuit (TDC);

converting the signal indicative of the delay of the test circuit into a second digital value using the TDC; and adjusting a supply voltage of the functional circuits based on a difference between the first digital value and the second digital value produced by the TDC.

11. The AVS method according to claim 10, wherein:

the functional circuits comprise Analog-to-Digital Converters (ADCs) and the test circuit comprises a test ADC; and the delay of the test circuit comprises a conversion delay of the test ADC, the conversion delay being a time duration needed for converting an analog input value into a corresponding digital value.

12. The AVS method according to claim 11, wherein each of the functional ADCs, and the test ADC, comprise Successive Approximation Register (SAR) ADCs, each ADC having a respective variable conversion delay.

13. The AVS method according to claim 11, wherein the one or more functional ADCs comprise a multiplicity of functional ADCs configured to sample respective mutually-delayed replicas of an input signal at a first sampling rate, thereby forming an interleaved ADC that samples the input signal at a second sampling rate, higher than the first sampling rate.

14. The AVS method according to claim 11, wherein the signal indicative of the delay comprises an End-of-Conversion (EoC) signal indicative of completion of each conversion operation.

15. The AVS method according to claim 10, wherein adjusting the supply voltage comprises controlling an adjustable power supply to adjust the supply voltage of the functional circuits.

16. The AVS method according to claim 10, wherein determining the delay comprises determining the delay of the test circuit for multiple values of the supply voltage, and wherein adjusting the supply voltage comprises setting the supply voltage to a value that minimizes a power consumption of the functional circuits.

17. The AVS method according to claim 10, wherein determining the delay comprises determining the delay of the test circuit for multiple values of the supply voltage, and wherein adjusting the supply voltage comprises setting the supply voltage to a value that minimizes a power consumption of the functional circuits while still meeting a speed requirement of the functional circuit.

18. The AVS method according to claim 10, wherein determining the delay comprises determining the delay of the test circuit for multiple values of the supply voltage, and wherein adjusting the supply voltage comprises setting the supply voltage to a value that minimizes a power consumption the functional circuit but is greater than a preset minimal voltage.

* * * * *